(12) United States Patent
Bonifacio et al.

(10) Patent No.: US 11,152,288 B2
(45) Date of Patent: Oct. 19, 2021

(54) LEAD FRAMES FOR SEMICONDUCTOR PACKAGES

(71) Applicant: Infineon Technologies AG, Neubiberg (DE)

(72) Inventors: Eric Lopez Bonifacio, Melaka (MY); Thorsten Hinderer, Neubiberg (DE); Fortunato Lopez, Unterhaching (DE); Norliza Morban, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/394,557

(22) Filed: Apr. 25, 2019

(65) Prior Publication Data
US 2020/0343166 A1 Oct. 29, 2020

(51) Int. Cl.
| | |
|---|---|
| *H01L 23/495* | (2006.01) |
| *H01L 23/31* | (2006.01) |
| *H01L 25/065* | (2006.01) |
| *H01L 25/18* | (2006.01) |
| *H01L 23/00* | (2006.01) |
| *H01L 21/56* | (2006.01) |
| *H01L 25/00* | (2006.01) |

(52) U.S. Cl.
CPC ...... *H01L 23/49555* (2013.01); *H01L 21/565* (2013.01); *H01L 23/3121* (2013.01); *H01L 23/49503* (2013.01); *H01L 23/49575* (2013.01); *H01L 24/48* (2013.01); *H01L 24/85* (2013.01); *H01L 25/0655* (2013.01); *H01L 25/18* (2013.01); *H01L 25/50* (2013.01); *H01L 2224/48137* (2013.01); *H01L 2224/48247* (2013.01); *H01L 2924/1431* (2013.01)

(58) Field of Classification Search
CPC .......... H01L 23/49555; H01L 23/3121; H01L 23/49503; H01L 23/49575; H01L 24/48; H01L 25/0655; H01L 25/18; H01L 25/50; H01L 21/565
See application file for complete search history.

(56) References Cited

U.S. PATENT DOCUMENTS

| | | | |
|---|---|---|---|
| 5,780,923 A * | 7/1998 | Courtenay | H01L 23/4951 257/666 |
| 5,793,099 A * | 8/1998 | Murakami | H01L 23/3107 257/666 |
| 6,010,920 A | 1/2000 | Hellgren et al. | |
| 6,543,131 B1 | 4/2003 | Beroz et al. | |

(Continued)

OTHER PUBLICATIONS

"Quasi-Resonant 700 V/800 V CoolSET—in DIP-7 and DSO-12 Package", Infineon Technologies, Aug. 11, 2017.

(Continued)

*Primary Examiner* — Nathan W Ha
(74) *Attorney, Agent, or Firm* — Dicke, Billig & Czaja, PLLC

(57) ABSTRACT

A lead frame includes a first die paddle, a second die paddle, a first lead, a second lead, and a third lead. The first lead is coupled to a first side of the first die paddle. The second lead is coupled to a second side of the first die paddle opposite to the first side of the first die paddle. The third lead is coupled to a first side of the second die paddle. At least one of the first lead, the second lead, and the third lead is coupled to the corresponding die paddle via a zigzag shaped tie bar.

22 Claims, 4 Drawing Sheets

(56) References Cited

U.S. PATENT DOCUMENTS

| | | | |
|---|---|---|---|
| 7,977,773 B1* | 7/2011 | Cusack | H01L 23/49575 |
| | | | 257/666 |
| 2002/0140062 A1* | 10/2002 | Oida | H01L 23/3121 |
| | | | 257/668 |
| 2003/0020148 A1* | 1/2003 | Kiyohara | H01L 23/49544 |
| | | | 257/666 |
| 2004/0256742 A1* | 12/2004 | Usui | H01L 23/49575 |
| | | | 257/787 |
| 2009/0130996 A1* | 5/2009 | Kudaishi | H01L 24/48 |
| | | | 455/90.3 |
| 2016/0027721 A1* | 1/2016 | Lee | H01L 24/97 |
| | | | 174/261 |
| 2016/0043811 A1* | 2/2016 | Yaginuma | H01L 24/97 |
| | | | 257/82 |
| 2017/0221799 A1* | 8/2017 | Chang | H01L 23/49575 |
| 2017/0345742 A1* | 11/2017 | Sakamoto | H01L 23/4952 |
| 2018/0076909 A1* | 3/2018 | Latham | H01L 25/0655 |
| 2018/0090419 A1* | 3/2018 | Ho | H01L 23/49555 |
| 2018/0102302 A1 | 4/2018 | Grassman et al. | |
| 2018/0108598 A1* | 4/2018 | Niu | H05K 3/32 |
| 2018/0261731 A1* | 9/2018 | Wojcik | H01L 33/54 |
| 2020/0258820 A1* | 8/2020 | Ko | H01L 23/645 |
| 2020/0273781 A1* | 8/2020 | Scharf | H01L 23/3107 |
| 2020/0321228 A1* | 10/2020 | Hosokawa | H01L 25/00 |

OTHER PUBLICATIONS

"2ED020I12FA Dual IGBT Driver IC SP001054678", Infineon Technologies AG, Apr. 5, 2016.

* cited by examiner

LEAD FRAMES FOR SEMICONDUCTOR PACKAGES

BACKGROUND

Semiconductor packages including high voltage and low voltage external leads should have proper isolation between the high voltage and low voltage external leads to prevent unwanted current flow in dual small outline (DSO) packages including two semiconductor dies. Semiconductor packages including two die paddles also should have stable support for both of the die paddles. DSO packages may also include a small clearance between a semiconductor die edge and a die paddle edge with multiple ground bonds.

For these and other reasons, a need exists for the present disclosure.

SUMMARY

One example of a lead frame includes a first die paddle, a second die paddle, a first lead, a second lead, and a third lead. The first lead is coupled to a first side of the first die paddle. The second lead is coupled to a second side of the first die paddle opposite to the first side of the first die paddle. The third lead is coupled to a first side of the second die paddle. At least one of the first lead, the second lead, and the third lead is coupled to the corresponding die paddle via a zigzag shaped tie bar.

One example of a semiconductor package includes a lead frame, a first semiconductor die, a second semiconductor die, and a mold material. The lead frame includes a first die paddle, a second die paddle, a first lead coupled to a first side of the first die paddle, a second lead coupled to a second side of the first die paddle opposite to the first side of the first die paddle, and a third lead coupled to a first side of the second die paddle. The first semiconductor die is attached to the first die paddle. The second semiconductor die is attached to the second die paddle. The mold material encapsulates the first semiconductor die, the second semiconductor die, and at least a portion of the lead frame. The mold material defines a package length isolation parallel to the first side of the first die paddle and the first side of the second die paddle between the first lead and the third lead and a package width isolation perpendicular to the package length isolation. The package length isolation is greater than or equal to the package width isolation.

One example of a method for fabricating a semiconductor package includes attaching a first semiconductor die to a first die paddle of a lead frame and attaching a second semiconductor die to a second die paddle of the lead frame. The lead frame includes a first lead and a third lead on a first side of the lead frame and a second lead on a second side of the lead frame opposite to the first side. Each of the first lead and the second lead is coupled to the first die paddle via a corresponding zigzag shaped tie bar. The third lead is coupled to the second die paddle via a zigzag shaped tie bar. The method includes wire bonding the first semiconductor die to the first lead and the second lead. The method includes wire bonding the second semiconductor die to the third lead. The method includes encapsulating the first semiconductor die, the second semiconductor die, the wire bonds, and at least a portion of the lead frame with a mold material.

DETAILED DESCRIPTION

In the following detailed description, reference is made to the accompanying drawings which form a part hereof, and in which is shown by way of illustration specific examples in which the disclosure may be practiced. It is to be understood that other examples may be utilized and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

Disclosed herein are lead frames for semiconductor packages including at least one lead coupled to a die paddle via a zigzag shaped tie bar. The zigzag shaped tie bar increases the isolation clearance of a semiconductor package. The lead and zigzag shaped tie bar serves as both a functional lead where interconnects (e.g., ground bonds) may be directly bonded and as a tie bar to support the die paddle. Non-functional leads are eliminated from the semiconductor packages disclosed herein due to the absence of internal leads (e.g., which may be incorporated into the lead frame design) and the removal of external leads after the encapsulation process to provide the required minimum isolation between high voltage and low voltage functional external leads. The semiconductor packages have an outer appearance resembling twin packages joined together in a single molded package with a wide gap between sets of external leads providing an isolation gap for the longer side (e.g., a package length isolation) equal to or greater than that of the shorter side (e.g., a package width isolation) of the package.

The semiconductor packages disclosed herein provide flexibility in terms of board mounting layout for isolation between high voltages and low voltages. In some embodiments, the semiconductor packages disclosed herein provide the advantage of having a sufficient creepage distance between the leads respectively connected to the high voltages and the low voltages, without increasing the total size of the whole package, and without changing the outline of the package. In other embodiments, a high voltage die and a low voltage die may be arranged closer together within the package while maintaining sufficient creepage distance along the outline of the package. In addition, two systems may be combined into a single semiconductor package. The single semiconductor package may have a smaller footprint compared to two individual packages. Further, material costs may be reduced by combining two systems into a single semiconductor package.

Figure 1A:
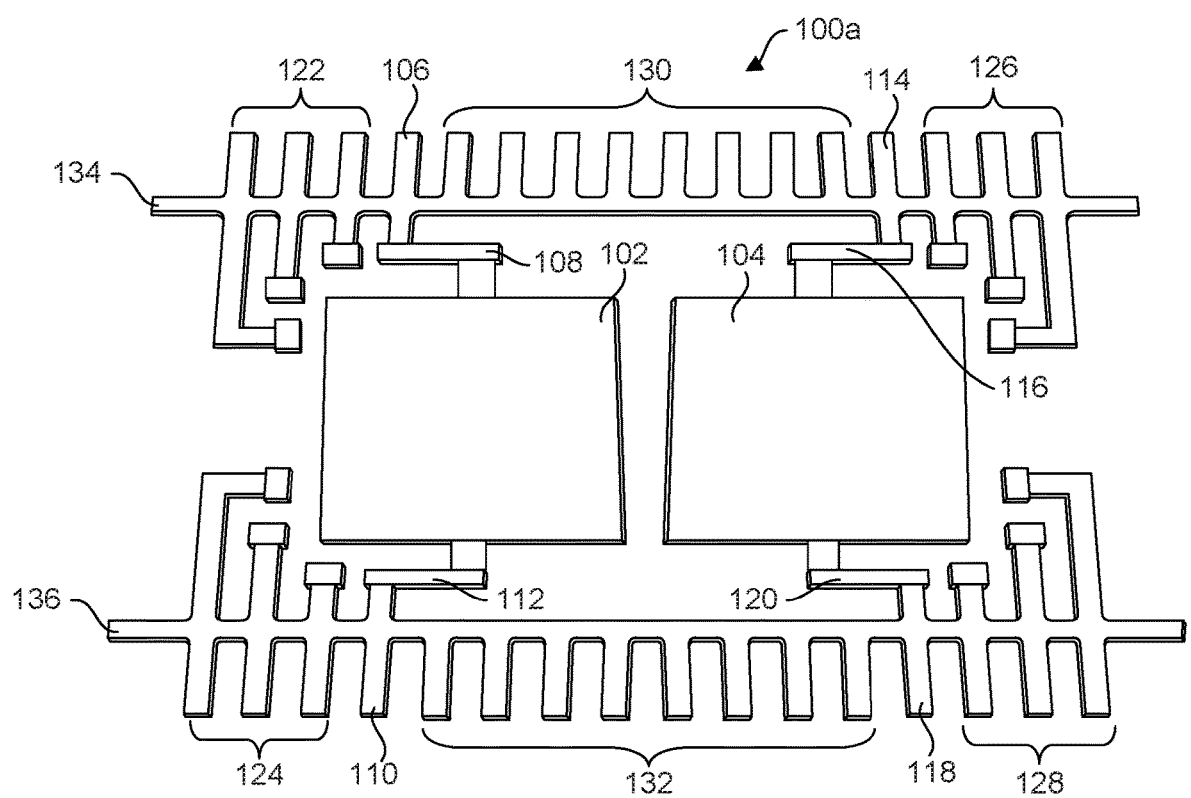
FIGS. 1A-1C illustrate top views of various examples of a lead frame.

FIG. 1A illustrates a top view of one example of a lead frame 100a. Lead frame 100a includes a first die paddle 102, a second die paddle 104, a first lead 106, a second lead 110, a third lead 114, and a fourth lead 118. Lead frame 100a has a metal surface, such as Ag, Cu, Ni/Pd/Au, NiNiP, Ni/Pd/AuAg. The first lead 106 is coupled to a first side of the first die paddle 102. The second lead 110 is coupled to a second side of the first die paddle 102 opposite to the first side of the first die paddle 102. The third lead 114 is coupled to a first side of the second die paddle 104. The fourth lead 118 is coupled to a second side of the second die paddle 104 opposite to the first side of the second die paddle 104.

The first lead 106 is coupled to the first die paddle 102 via a zigzag shaped tie bar 108. In one example, the first lead 106 is coupled to the first die paddle 102 at the center of the first side of the first die paddle 102. The second lead 110 is coupled to the first die paddle 102 via a zigzag shaped tie bar 112. In one example, the second lead 110 is coupled to the first die paddle 102 at the center of the second side of the first die paddle 102. The third lead 114 is coupled to the second die paddle 104 via a zigzag shaped tie bar 116. In one example, the third lead 114 is coupled to the second die paddle 104 at the center of the first side of the second die paddle 104. The fourth lead 118 is coupled to the second die paddle 104 via a zigzag shaped tie bar 120. In one example, the fourth lead 118 is coupled to the second die paddle 104 at the center of the second side of the second die paddle 104. In other embodiments, the first/second/third/fourth leads are not necessarily connected to the center of the corresponding die paddles. Rather, the leads may by connected at other locations of the die paddles for providing sufficient support between the die paddles and the lead frame or lead frame strip. One benefit of this is to provide sufficient stability for the die paddles during some later manufacturing processes.

Lead frame 100a also includes a first plurality of leads 122 adjacent to the first lead 106, a second plurality of leads 124 adjacent to the second lead 110, a third plurality of leads 126 adjacent to the third lead 114, and a fourth plurality of leads 128 adjacent to the fourth lead 118. The first lead 106 and the third lead 114 are between the first plurality of leads 122 and the third plurality of leads 126. The second lead 110 and the fourth lead 118 are between the second plurality of leads 124 and the fourth plurality of leads 128. Leads 106, 110, 114, 118, 122, 124, 126, and 128 are functional leads. Lead frame 100a also includes first non-functional leads 130 between first lead 106 and third lead 114 and second non-functional leads 132 between second lead 110 and fourth lead 118. Leads 106, 114, 122, 126, and 130 are coupled to each other via dam bars 134. Leads 110, 118, 124, 128, and 132 are coupled to each other via dam bars 136. In some embodiments, the die pads 102 and 104, the leads 106, 110, 114, 118, 122, 124, 126, 128, 130, and 132, the zigzag shaped tie bars 108, 112, 116, and 120, and the dam bars 134 and 136 are all arranged in a single plane.

Each zigzag shaped tie bar 108, 112, 116, and 120 may include a first portion aligned with the corresponding lead 106, 110, 114, and 118. Each zigzag shaped tie bar may include a second portion extending perpendicular to the first portion and coupled to the first portion at one end. Each zigzag shaped tie bar may include a third portion parallel to the first portion and coupled between the other end of the second portion and a corresponding die paddle 102 and 104. Zigzag shaped tie bars 108 and 112 support first die paddle 102, and zigzag shaped tie bars 116 and 120 support second die paddle 104. As will be described below, zigzag shaped tie bars 108 and 116 increase the isolation clearance between first lead 106 and third lead 114, and zigzag shaped tie bars 112 and 120 increase the isolation clearance between second lead 110 and fourth lead 118. It is noted that the "zigzag shaped tie bar" is different from the shape of traditional leads that go through a form-and-trim process.

Figure 1B:
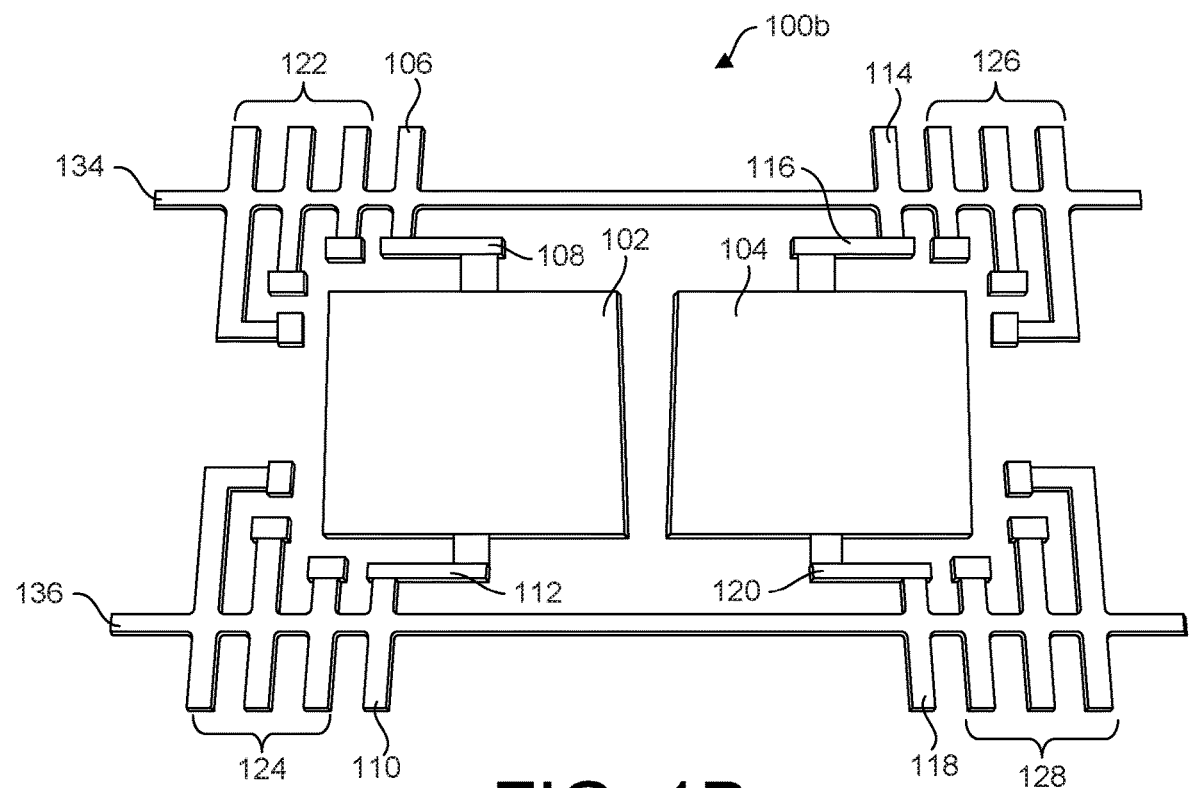

FIG. 1B illustrates a top view of another example of a lead frame 100b. Lead frame 100b is similar to lead frame 100a previously described and illustrated with reference to FIG. 1A, except that in lead frame 100b, non-functional leads 130 and 132 are excluded. In this example, a dam bar 134 extends between first lead 106 and third lead 114, and a dam bar 136 extends between second lead 110 and fourth lead 118. By excluding non-functional leads, material costs may be reduced for lead frame 100b compared to lead frame 100a of FIG. 1A.

Figure 1C:
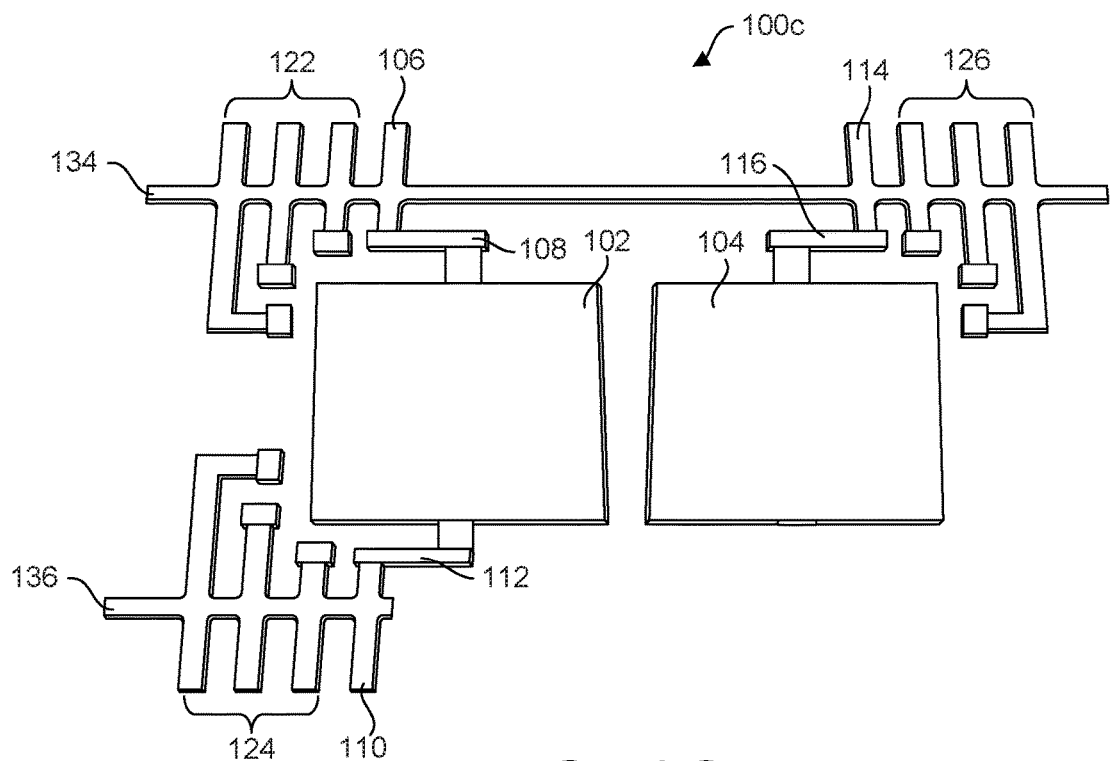

FIG. 1C illustrates a top view of another example of a lead frame 100c. Lead frame 100c is similar to lead frame 100b previously described and illustrated with reference to FIG. 1B, except that in lead frame 100c, leads 118 and 128 and zigzag shaped tie bar 120 are excluded. Lead frame 100c may be used when less leads are needed for a semiconductor package.

Figure 2:
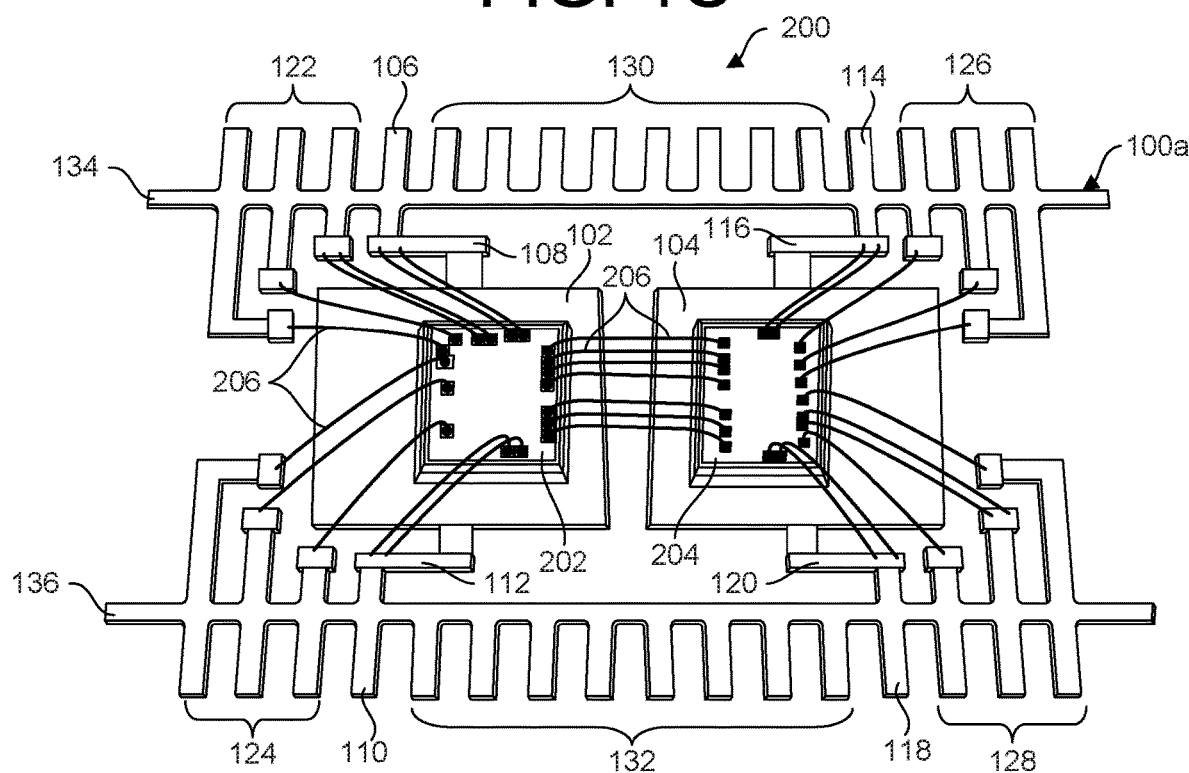
FIG. 2 illustrates a top view of one example of a semiconductor assembly.

FIG. 2 illustrates a top view of one example of a semiconductor assembly 200. Semiconductor assembly 200 includes a lead frame 100a as previously described and illustrated with reference to FIG. 1A. In addition, semiconductor assembly 200 includes a first semiconductor die 202 and a second semiconductor die 204. While semiconductor assembly 200 includes lead frame 100a, in other examples, semiconductor assembly 200 may include lead frame 100b of FIG. 1B or lead frame 100c of FIG. 1C in place of lead frame 100a.

The first semiconductor die 202 is attached to the first die paddle 102. The second semiconductor die 204 is attached to the second die paddle 104. The first semiconductor die 202 and the second semiconductor die 204 may be attached to the first die paddle 102 and the second die paddle 104 via a glue (e.g., epoxy), a solder, or another suitable material. In one example, the first semiconductor die 202 may be electrically coupled to the first die paddle 102, and the second semiconductor die 204 may be electrically coupled to the second die paddle 104.

With the first semiconductor die 202 and the second semiconductor die 204 attached to first die paddle 102 and second die paddle 104, the first semiconductor die 202 and the second semiconductor die 204 may be wire bonded to each other and to leads 106, 110, 114, 118, 122, 124, 126, and 128. For example, the first semiconductor die 202 may be wire bonded to the first lead 106 and the second lead 110, and the second semiconductor die 204 may be wire bonded to the third lead 114 and the fourth lead 118. The bond wires 206 electrically couple the first semiconductor die 202 and the second semiconductor die 204 to each other and to leads 106, 110, 114, 118, 122, 124, 126, and 128. In one example, the wire bonds 206 electrically coupling the first semiconductor die 202 to leads 106 and 110 and electrically coupling the second semiconductor die 204 to leads 114 and 118 are ground bonds.

In one example, the first semiconductor die 202 includes a high voltage (e.g., greater than 12V, 48V, 100V, or 1 kV) semiconductor die, and the second semiconductor die 204 includes a low voltage semiconductor die wherein the low voltage is less than the high voltage (e.g., low voltage of 12V or less). In another example, the first semiconductor die 202 includes a power semiconductor die, and the second semiconductor die 204 includes a logic semiconductor die. Accordingly, leads 106, 110, 122, and 124 may be high voltage leads, and leads 114, 118, 126, and 128 may be low voltage leads.

Figure 3:
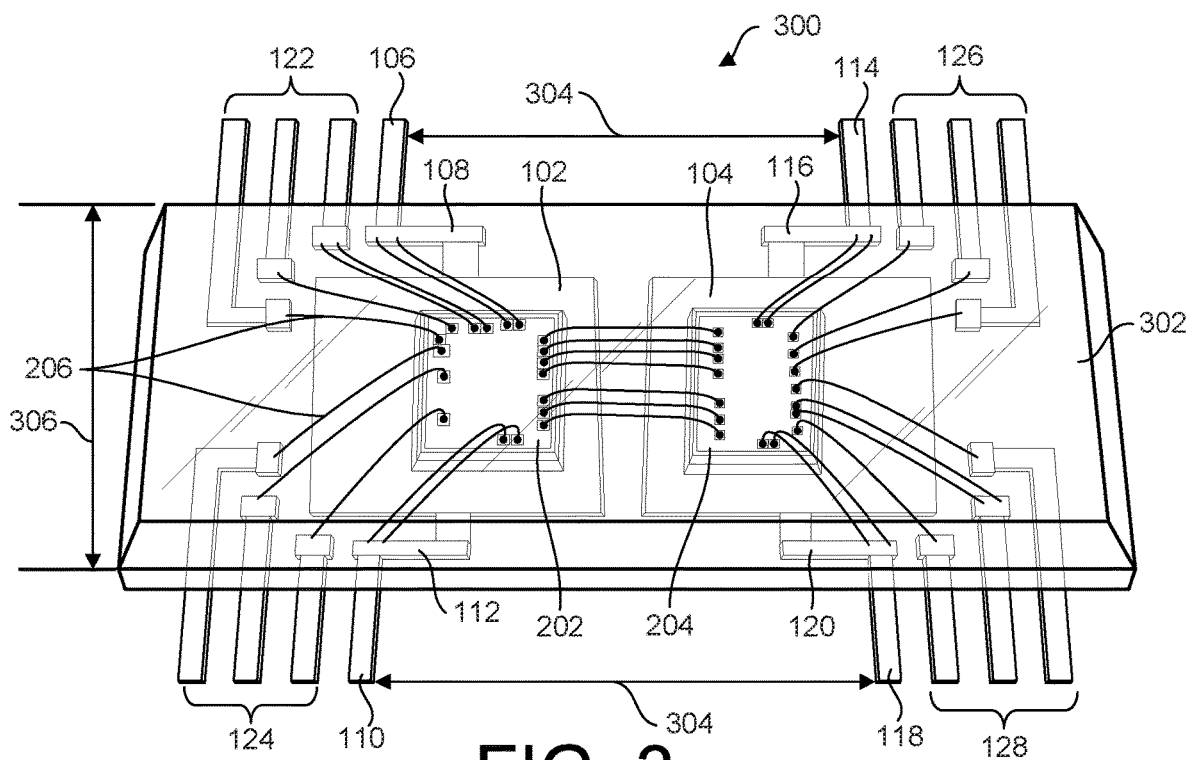
FIG. 3 illustrates a top internal view of one example of a semiconductor package after encapsulation and singulation of leads.

FIG. 3 illustrates a top internal view of one example of a semiconductor package 300 after encapsulation and singulation of leads. The semiconductor assembly 200 of FIG. 2 is encapsulated with a mold material 302 to provide semiconductor package 300. The first semiconductor die 202, the second semiconductor die 204, the wire bonds 206, and at least a portion of the lead frame 110a are encapsulated with the mold material 302. After encapsulation with mold material 302, the non-functional leads 130 and 132 are removed. In addition, the dam bars 134 and 136 are removed such that leads 106, 110, 114, 118, 122, 124, 126, and 128 are electrically separated from each other.

The mold material may include an epoxy or another suitable dielectric material. The mold material 302 defines a package length isolation 304 parallel to the first side of the first die paddle 102 and the first side of the second side paddle 104 between the first lead 106 and the third lead 114. In this example, the mold material 302 also defines the package length isolation 304 parallel to the second side of the first die paddle 102 and the second side of the second side paddle 104 between the second lead 110 and the fourth lead 118. The mold material 302 also defines a package width isolation 306 perpendicular to the package length isolation 304. In one example, the package length isolation 304 is defined as the creepage distance between the first lead 106 and the third lead 114 or between the second lead 110 and the fourth lead 118. In one example, the package width isolation 306 is defined as the creepage distance between the first plurality of leads 122 and the second plurality of leads 124 or between the third plurality of leads 126 and the fourth plurality of leads 128. The package length isolation 304 is greater than or equal to the package width isolation 306. In one example, the package length isolation 304 is at least 4 mm. In some embodiments, this arrangement of the leads provides the benefit of the creepage distance between the high and low voltage dies, which normally is along one long side of the package, being longer than the creepage distance between the two opposite sides of the high voltage die, which normally is along the width direction of the package. Therefore, the risk of power leakage or damage from the high voltage die to the low voltage die is reduced. Further, by using the zigzag shaped tie bar within the package, the high voltage die and the low voltage die may be arranged closer together within the package, but the corresponding external leads are kept distant for meeting the creepage distance requirement.

Figure 4A:
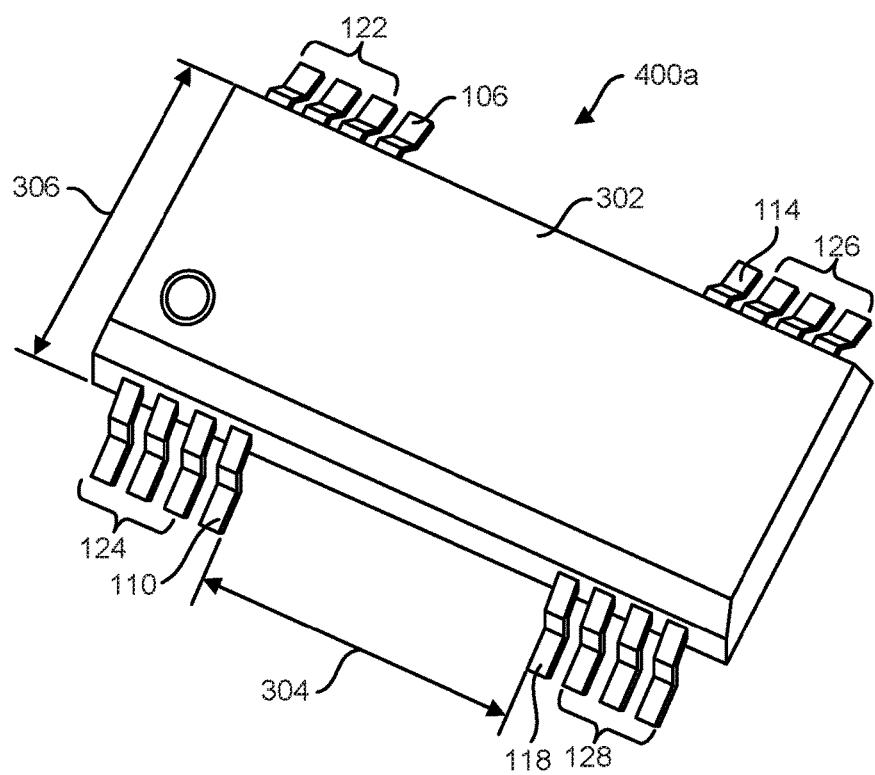
FIGS. 4A-4C illustrate top views of various examples of a semiconductor package.

FIG. 4A illustrates a top view of one example of a semiconductor package 400a. Semiconductor package 400a is semiconductor package 300 of FIG. 3 after shaping leads 106, 110, 114, 118, 122, 124, 126, and 128. In this example, the leads 106, 110, 114, 118, 122, 124, 126, and 128 are shaped to enable semiconductor package 400a to be surface mounted to a substrate (e.g., a printed circuit board).

Figure 4B:
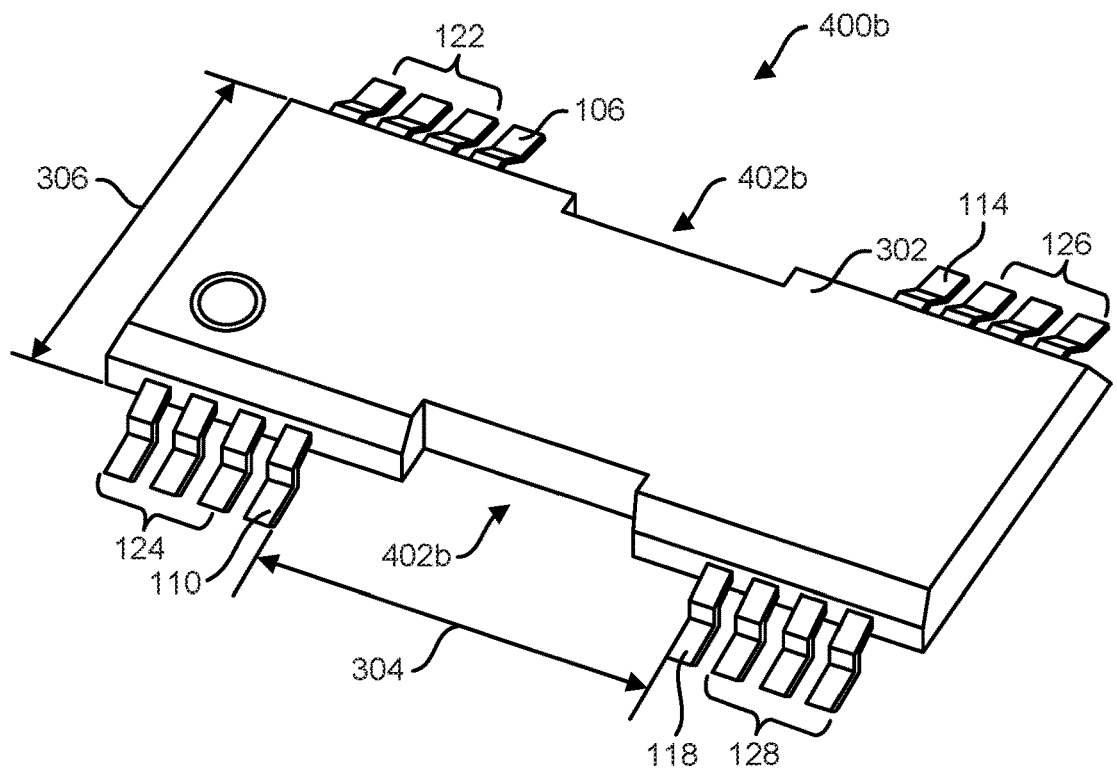

FIG. 4B illustrates a top view of another example of a semiconductor package 400b. Semiconductor package 400b is similar to semiconductor package 400a previously described and illustrated with reference to FIG. 4A, except that in semiconductor package 400b mold material 302 includes a recess 402b between the first lead 106 and the third lead 114 and between the second lead 110 and the fourth lead 118. Each recess 402b increases the package length isolation 304 since the creepage distance between the first lead 106 and the third lead 114 and between the second lead 110 and the fourth lead 118 is increased due to the corresponding recess 402b.

Figure 4C:
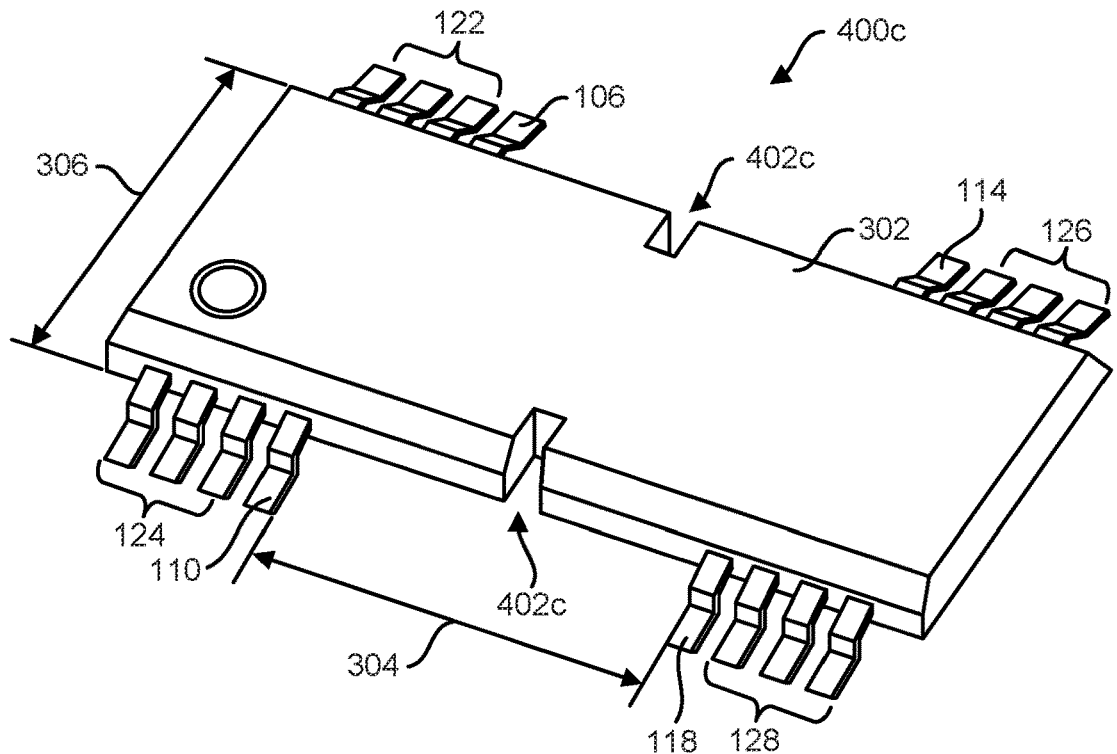

FIG. 4C illustrates a top view of another example of a semiconductor package 400c. Semiconductor package 400c is similar to semiconductor package 400b previously described and illustrated with reference to FIG. 4B, except that in semiconductor package 400c each recess 402c is smaller than each recess 402b of FIG. 4B. Each recess 402c increases the package length isolation 304 since the creepage distance between the first lead 106 and the third lead 114 and between the second lead 110 and the fourth lead 118 is increased due to the corresponding recess 402c.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein. Therefore, it is intended that this disclosure be limited only by the claims and the equivalents thereof.

The invention claimed is:

1. A lead frame comprising:
    a first die paddle;
    a second die paddle;
    a first lead disposed along a first side of the lead frame and coupled to and perpendicular to a first side of the first die paddle facing the first side of the lead frame;
    a second lead disposed along a second side of the lead frame and coupled to and perpendicular to a second side of the first die paddle opposite to the first side of the first die paddle facing the second side of the lead frame; and
    a third lead disposed along the first side of the lead frame and coupled to and perpendicular to a first side of the second die paddle facing the first side of the lead frame,
    wherein at least one of the first lead, the second lead, and the third lead is coupled to the corresponding die paddle via a zigzag shaped tie bar.

2. The lead frame of claim 1, further comprising:
    a fourth lead coupled to a second side of the second die paddle opposite to the first side of the second die paddle facing the second side of the lead frame.

3. The lead frame of claim 2, wherein each of the first lead, the second lead, the third lead, and the fourth lead is coupled to the corresponding die paddle via a zigzag shaped tie bar.

4. The lead frame of claim 2, wherein the first lead is coupled to the first die paddle at the center of the first side of the first die paddle,
    wherein the second lead is coupled to the first die paddle at the center of the second side of the first die paddle,
    wherein the third lead is coupled to the second die paddle at the center of the first side of the second die paddle, and
    wherein the fourth lead is coupled to the second die paddle at the center of the second side of the second die paddle.

5. The lead frame of claim 1, wherein the zigzag shaped tie bar, the first die pad, the second die pad, the first lead, the second lead, and the third lead are arranged in a single plane.

6. The lead frame of claim 2, further comprising:
    a first plurality of leads adjacent to the first lead;
    a second plurality of leads adjacent to the second lead;
    a third plurality of leads adjacent to the third lead; and
    a fourth plurality of leads adjacent to the fourth lead,
    wherein the first lead and the third lead are between the first plurality of leads and the third plurality of leads,
    wherein the second lead and the fourth lead are between the second plurality of leads and the fourth plurality of leads; and
    wherein a distance between the first lead and the third lead is greater than a distance between the first lead and the first plurality of leads.

7. The lead frame of claim 1, wherein the lead frame comprises no leads between the first lead and the third lead along the first side of the lead frame.

8. A semiconductor package comprising:
- a lead frame comprising a first die paddle, a second die paddle, a first lead coupled to a first side of the first die paddle, a second lead coupled to a second side of the first die paddle opposite to the first side of the first die paddle, and a third lead coupled to a first side of the second die paddle, the first and third leads disposed along a first side of the lead frame and the second lead disposed along a second side of the lead frame opposite the first side of the lead frame;
- a first semiconductor die attached to the first die paddle;
- a second semiconductor die attached to the second die paddle; and
- a mold material encapsulating the first semiconductor die, the second semiconductor die, and at least a portion of the lead frame, the mold material defining a package length isolation parallel to the first side of the first die paddle and the first side of the second die paddle between the first lead and the third lead and a package width isolation perpendicular to the package length isolation,
- wherein the package length isolation is greater than or equal to the package width isolation, and
- wherein the package length isolation is defined as the creepage distance between the first lead and the third lead.

9. The semiconductor package of claim 8, wherein at least one of the first lead, the second lead, and the third lead is coupled to the corresponding die paddle via a zigzag shaped tie bar.

10. The semiconductor package of claim 8, further comprising:
- a fourth lead coupled to a second side of the second die paddle opposite to the first side of the second die paddle and disposed along the second side of the lead frame,
- wherein each of the first lead, the second lead, the third lead, and the fourth lead is coupled to the corresponding die paddle via a zigzag shaped tie bar.

11. The semiconductor package of claim 10, further comprising:
- a first plurality of leads adjacent to the first lead;
- a second plurality of leads adjacent to the second lead;
- a third plurality of leads adjacent to the third lead; and
- a fourth plurality of leads adjacent to the fourth lead,
- wherein the first lead and the third lead are between the first plurality of leads and the third plurality of leads, and
- wherein the second lead and the fourth lead are between the second plurality of leads and the fourth plurality of leads.

12. The semiconductor package of claim 11, wherein each of the first plurality of leads and each of the second plurality of leads are electrically coupled to the first semiconductor die, and
- wherein each of the third plurality of leads and each of the fourth plurality of leads are electrically coupled to the second semiconductor die.

13. The semiconductor package of claim 8, wherein the first semiconductor die comprises a high voltage semiconductor die, and
- wherein the second semiconductor die comprises a low voltage semiconductor die.

14. The semiconductor package of claim 8, wherein the first semiconductor die comprises a power semiconductor die, and
- wherein the second semiconductor die comprises a logic semiconductor die.

15. The semiconductor package of claim 8, wherein the first semiconductor die is electrically coupled to the second semiconductor die.

16. The semiconductor package of claim 8, wherein the first semiconductor die is electrically coupled to the first die paddle, and
- wherein the second semiconductor die is electrically coupled to the second die paddle.

17. The semiconductor package of claim 8, wherein the mold material comprises a recess between the first lead and the third lead to increase the package length isolation.

18. A method for fabricating the semiconductor package of claim 8, the method comprising:
- attaching a first semiconductor die to a first die paddle of a lead frame and attaching a second semiconductor die to a second die paddle of the lead frame, the lead frame comprising a first lead and a third lead on a first side of the lead frame and a second lead on a second side of the lead frame opposite to the first side, each of the first lead and the second lead coupled to the first die paddle via a corresponding zigzag shaped tie bar, and the third lead coupled to the second die paddle via a zigzag shaped tie bar;
- wire bonding the first semiconductor die to the first lead and the second lead;
- wire bonding the second semiconductor die to the third lead; and
- encapsulating the first semiconductor die, the second semiconductor die, the wire bonds, and at least a portion of the lead frame with a mold material.

19. The method of claim 18, wherein the lead frame comprises non-functional leads between the first lead and the third lead, the method further comprising:
- removing the non-functional leads.

20. The method of claim 18, wherein the lead frame comprises no leads between the first lead and the third lead.

21. The method of claim 18, wherein a distance between the first lead and the third lead is greater than or equal to a width of the mold material extending perpendicular to the first side and the second side of the lead frame.

22. The semiconductor package of claim 8, wherein the lead frame comprises no leads between the first lead and the third lead along the first side of the lead frame.

* * * * *